(12) United States Patent
Morgan et al.

(10) Patent No.: US 11,064,293 B2
(45) Date of Patent: *Jul. 13, 2021

(54) SYSTEMS, APPARATUS AND METHODS FOR DYNAMIC RANGE ENHANCEMENT OF AUDIO SIGNALS

(71) Applicant: Cirrus Logic International Semiconductor Ltd., Edinburgh (GB)

(72) Inventors: Ross Crawford Morgan, Edinburgh (GB); Robert David Rand, Edinburgh (GB); Richard Colin Fitzgerald, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/667,224

(22) Filed: Oct. 29, 2019

(65) Prior Publication Data

US 2020/0068299 A1 Feb. 27, 2020

Related U.S. Application Data

(63) Continuation of application No. 15/995,455, filed on Jun. 1, 2018, now Pat. No. 10,499,147.

(Continued)

(30) Foreign Application Priority Data

Jul. 19, 2017 (GB) .................................... 1711583

(51) Int. Cl.
*H03G 3/00* (2006.01)
*H04R 3/00* (2006.01)
(Continued)

(52) U.S. Cl.
CPC .............. *H04R 3/00* (2013.01); *G10L 21/034* (2013.01); *H03G 3/002* (2013.01);
(Continued)

(58) Field of Classification Search
CPC .. H04R 3/00; H04R 2420/01; H04R 2430/01; G10L 21/034; H03G 3/002; H03G 3/3005
(Continued)

(56) References Cited

U.S. PATENT DOCUMENTS 10,499,147 B2 * 12/2019 Morgan ................ G10L 21/034
2003/0081796 A1 * 5/2003 Bray ........................ H04B 1/20
381/86

(Continued)

FOREIGN PATENT DOCUMENTS

CA 2840730 A1 11/2016
CN 202095090 U 12/2011
(Continued)

OTHER PUBLICATIONS

International Search Report and Written Opinion of the International Searching Authority, International Application No. PCT/GB2018/051424, dated Jul. 16, 2018.
(Continued)

*Primary Examiner* — Ammar T Hamid
(74) *Attorney, Agent, or Firm* — Jackson Walker L.L.P.

(57) ABSTRACT

There is provided an apparatus for providing an output signal to an audio transducer, comprising: a first signal path for receiving a first digital audio input signal, applying a first digital gain, and outputting an amplified first digital audio input signal; a second signal path, for receiving a second digital audio input signal, applying a second digital gain, and outputting an amplified second digital audio input signal; converter circuitry, coupled to the first and second signal paths, for converting at least the amplified first and second digital audio input signals into the analogue domain, and outputting an analogue audio input signal; and an analogue gain element, for applying an analogue gain to the analogue audio input signal and outputting the output signal. The (Continued)

apparatus further comprises a control circuit, coupled to the first and second signal paths, operative to select the analogue gain based on a combination of at least the first and second digital audio input signals or signals derived therefrom, and to select the first and second digital gains so as to compensate for the analogue gain.

20 Claims, 6 Drawing Sheets

Related U.S. Application Data (60) Provisional application No. 62/515,799, filed on Jun. 6, 2017.

(51) Int. Cl.
  *H03G 3/30* (2006.01)
  *G10L 21/034* (2013.01)
(52) U.S. Cl.
  CPC ....... *H03G 3/3005* (2013.01); *H04R 2420/01* (2013.01); *H04R 2430/01* (2013.01)
(58) Field of Classification Search
  USPC .......................................... 381/104, 119, 107
  See application file for complete search history.

(56) References Cited

U.S. PATENT DOCUMENTS

| | | | |
|---|---|---|---|
| 2008/0123873 A1* | 5/2008 | Bjorn-Josefsen | H03G 3/004 381/106 |
| 2009/0220110 A1 | 9/2009 | Bazarjani et al. | |
| 2012/0188111 A1 | 7/2012 | Ledzius et al. | |
| 2013/0106635 A1* | 5/2013 | Doi | H03M 1/70 341/144 |
| 2013/0156207 A1 | 6/2013 | Visser et al. | |
| 2014/0334643 A1 | 11/2014 | Pinna et al. | |
| 2015/0237432 A1* | 8/2015 | Miluzzi | H04R 3/005 381/111 |
| 2015/0249466 A1* | 9/2015 | Elyada | H03M 1/70 341/144 |
| 2015/0289054 A1* | 10/2015 | Sakai | H04R 3/00 381/119 |
| 2016/0080862 A1 | 3/2016 | He et al. | |
| 2017/0242652 A1* | 8/2017 | Park | G11B 20/10527 |

FOREIGN PATENT DOCUMENTS

| | | |
|---|---|---|
| CN | 102611449 A | 7/2012 |
| CN | 102983816 A | 3/2013 |
| CN | 103138695 A | 6/2013 |
| CN | 106063124 A | 10/2016 |
| GB | 2527677 A | 12/2015 |
| WO | 2014160542 A2 | 10/2014 |
| WO | 2016040171 A2 | 3/2016 |

OTHER PUBLICATIONS

Combined Search and Examination Report, UKIPO, Application No. GB1711583.3, dated Jan. 22, 2018.

Office Action, China National Intellectual Property Administration, CN Application No. 201880037481.X, dated Apr. 26, 2020, no translation available.

\* cited by examiner

SYSTEMS, APPARATUS AND METHODS FOR DYNAMIC RANGE ENHANCEMENT OF AUDIO SIGNALS

This application is a continuation of U.S. patent application Ser. No. 15/995,455, filed Jun. 1, 2018, which claims priority to U.S. Provisional Patent Application No. 62/515,799, filed Jun. 6, 2017, and United Kingdom Patent Application No. 1711583.3, filed Jul. 19, 2017, each of which is incorporated by reference herein in its entirety.

TECHNICAL FIELD

Examples of the present disclosure relate to the provision of audio signals to an audio transducer, and particularly to systems, apparatus and methods using dynamic range enhancement for the provision of audio signals to an audio transducer.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of the amplifier, such that any increased dynamic range as a result of a high-gain amplifier may be offset by signal noise which may effectively mask lower-intensity audio signals.

Dynamic range enhancement (DRE) is a known technique to mitigate these issues. DRE is a three-stage process. In a first stage, digital gain is applied to an input digital signal; in a second stage, the digital signal is converted to the analogue domain by converter circuitry; and, in the third stage, an analogue gain is applied to the analogue signal. The digital gain may be determined dynamically, based on the amplitude of the input digital signal, and configured so as to increase the size of the digital signal at the input to the converter circuitry. In this way, the converter circuitry operates on a larger signal and as a result converts the signal to the analogue domain with lower noise. The analogue gain is configured to compensate for the digital gain, so that overall the signal is amplified to the required level, in spite of the dynamically changing digital gain. Thus DRE can be used to increase the dynamic range of an audio signal.

High quality audio playback is clearly a desirable feature for personal audio devices. However, such devices are becoming increasingly multi-functional, such that audio playback is only one of several functions which may be provided simultaneously by the device. For example, in a typical operating system there may be a variety of audio streams which can be classified into two groups: music (HiFi) and system sounds (keyclicks, alarms, ringtones). These different sounds must be mixed together into a single output audio stream.

Typically, such mixing is performed in software, and audio provided to amplifying circuitry as a single, pre-mixed audio stream.

Figure 1:
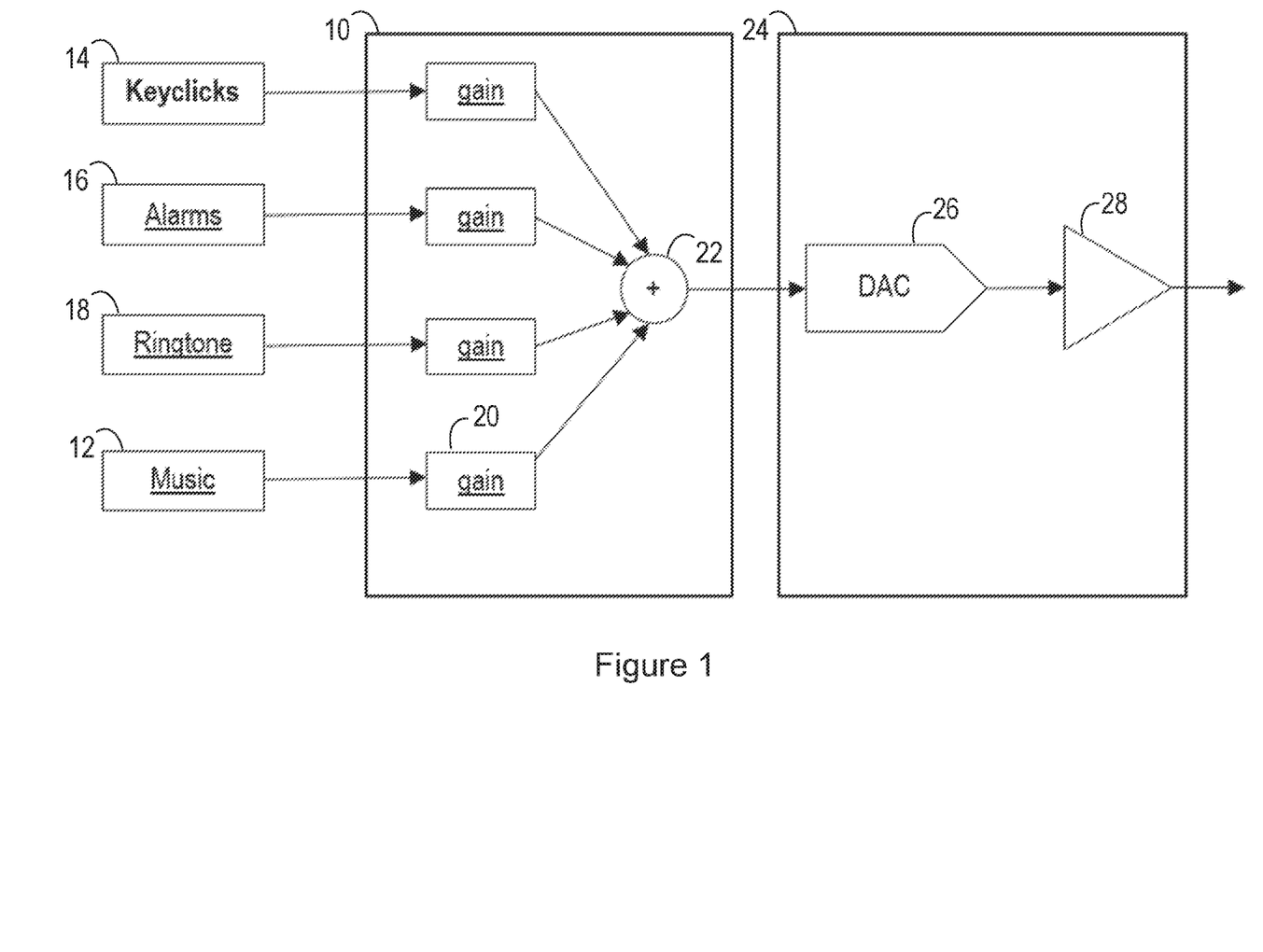
FIG. 1 shows a conventional approach to the amplification of multiple audio streams.

FIG. 1 shows an example of this approach. Music 12 and system sounds, such as keyclicks 14, alarms 16 and ringtones 18 are generated by software running on a processor circuit (such as an applications processor) 10. Gain is applied separately to each audio signal in respective gain elements 20, and the outputs of each gain element are mixed in a combining element 22. The gains to be applied may be user-defined, or set in system configuration.

The mixed signal is provided from the processor circuit 10 to an amplification circuit, or codec, 24. In the illustration the processor circuit 10 and the codec 24 are provided on separate integrated circuits; however, in general the circuits may be provided on the same integrated circuit. In the codec 24, the mixed signal is converted to the analogue domain in a digital-to-analogue converter (DAC) 26, and provided to a power amplifier 28 which amplifies the analogue signal and outputs to an audio transducer such as a set of headphones or a speaker.

The disadvantages of this approach are that total harmonic distortion (or total harmonic distortion plus noise, THD+N) and dynamic range are limited by applying gain and mixing within the number of available bits of the digital signal. This both limits the dynamic range across all attenuation levels and increases distortion levels, limiting THD+N performance.

SUMMARY

According to one aspect of the disclosure, there is provided an apparatus for providing an output signal to an audio transducer, comprising: a first signal path for receiving a first digital audio input signal, applying a first digital gain, and outputting an amplified first digital audio input signal; a second signal path, for receiving a second digital audio input signal, applying a second digital gain, and outputting an amplified second digital audio input signal; converter circuitry, coupled to the first and second signal paths, for converting at least the amplified first and second digital audio input signals into the analogue domain, and outputting an analogue audio input signal; and an analogue gain element, for applying an analogue gain to the analogue audio input signal and outputting the output signal. The apparatus further comprises a control circuit, coupled to the first and second signal paths, operative to select the analogue gain based on a combination of at least the first and second digital audio input signals or signals derived therefrom, and to select the first and second digital gains so as to compensate for the analogue gain.

In a further aspect, the disclosure provides an electronic device comprising an apparatus as recited above.

Another aspect provides a method for providing an output signal to an audio transducer, comprising: receiving a first digital audio input signal, applying a first digital gain, and outputting an amplified first digital audio input signal; receiving a second digital audio input signal, applying a second digital gain, and outputting an amplified second digital audio input signal; converting at least the amplified first and second digital audio input signals into the analogue domain, and outputting an analogue audio input signal; and applying an analogue gain to the analogue audio input signal and outputting the output signal. The analogue gain is determined based on a combination of at least the first and second digital audio input signals or signals derived therefrom, and wherein the first and second digital gains are determined so as to compensate for the analogue gain.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Embodiments of the present disclosure relate to an apparatus, such as a codec, for providing an output signal to an audio transducer. The apparatus comprises a first signal path for receiving a first digital audio input signal, applying a first digital gain, and outputting an amplified first digital audio input signal, and a second signal path, for receiving a second digital audio input signal, applying a second digital gain, and outputting an amplified second digital audio input signal. Converter circuitry converts the amplified first and second digital audio input signals into the analogue domain, and outputs an analogue audio input signal, and an analogue gain element applies an analogue gain to the analogue audio input signal and outputting the output signal. The analogue gain is determined based on a combination of at least the first and second digital audio input signals or signals derived therefrom (such as where one or more of the first and second digital audio input signals is multiplied by a respective volume parameter). The first and second digital gains are selected so as to compensate for the analogue gain.

In such a manner, dynamic range enhancement may be applied to the first digital audio input signal in the absence of the second digital audio input signal, while allowing for trade-off of the dynamic range when the second digital audio input signal is present.

Figure 2:
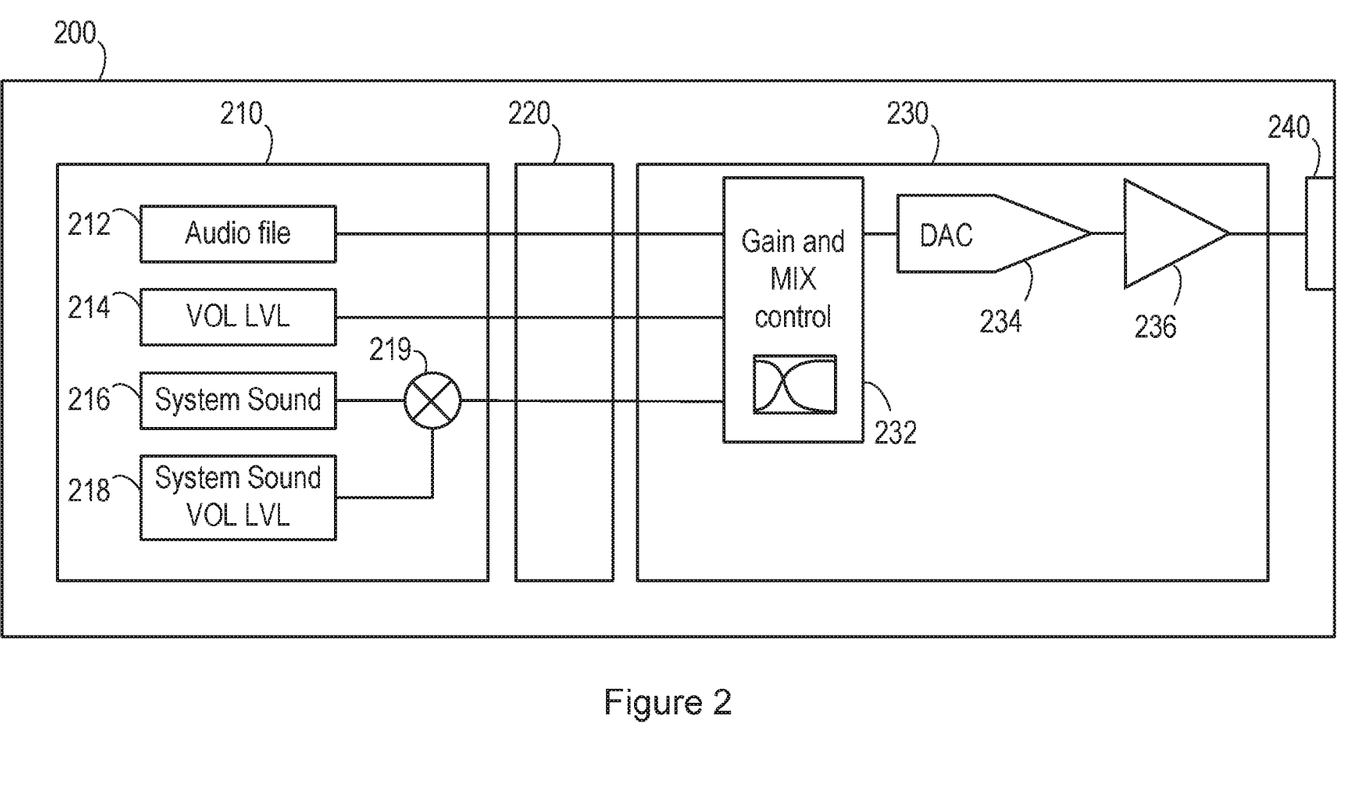
FIG. 2 shows an electronic device according to embodiments of the disclosure.

FIG. 2 shows an electronic device 200 according to embodiments of the disclosure. The device 200 is operable to provide high-fidelity playback of audio, such as music, to a user of the device. In addition, the device may generate so-called "system sounds", e.g., audio signals generated by an operating system or other software running on the device, responsive to detection of an event (e.g. an incoming message or call, an alarm, etc), or user input (e.g. button or key clicks, interaction with a game, etc). The electronic device may therefore comprise one or more of: a portable device; a battery-powered device; a communications device; a computing device; a mobile telephone; a laptop, notebook or tablet computer; a personal media player; a gaming device; and a wearable device.

The device 200 comprises processor circuitry 210, internal interface circuitry 220, a codec 230 and external interface circuitry 240. In general terms, according to the illustrated embodiment, multiple digital audio signals (as well as at least one volume parameter) are output from the processor circuitry 210, to the codec 230, via the internal interface circuitry 220. In the codec 230, the digital audio signals are processed, converted to the analogue domain, and amplified in a power amplifier. The detailed operation of the codec 230 is described below. The amplified signals are then output from the codec 230 and passed to the external interface circuitry 240 to be output from the device 200 to the user.

In the illustrated embodiment, the processing circuitry 210 and the codec 230 are each provided on separate integrated circuits (thus requiring internal interface circuitry 220 to effect the transfer of data from one to the other). In other embodiments, the functions of the codec 230 (described below) may be provided within the AP 210 itself, i.e. on the same integrated circuit.

The processor circuitry 210 may comprise any suitable processor or processor circuitry for running the electronic device 200 and the applications provided by it. For example, in one embodiment, the processor circuitry 210 may run an operating system and/or other applications provided by the electronic device. Such processor circuitry may be known as an applications processor (AP), and the processing circuitry 210 may also be termed the AP 210 herein.

As noted above, the AP 210 is operative to output a plurality of digital audio signals. The AP 210 may also output one or more volume signals associated with one or more of the plurality of digital audio signals.

At least one of the digital audio signals (e.g. a digital signal corresponding to music) may require high-fidelity output. Thus, in the illustrated embodiment, an audio file 212 (which may correspond to a music file) provides a first digital audio signal. A first volume parameter 214 is also provided by the AP 210, and is associated with the audio file 212 in that the first volume parameter is to be applied to the audio file before output to a user. For example, the first volume parameter may be written in a register within or accessible by the AP 210. The first volume parameter may be set based on some user input. For example, the user may specify the volume of music to be played from a particular application (e.g. through interaction with the application or configuration settings associated with the application), or from the device 200 in general (e.g. through interaction with the operating system or physical volume controls in the electronic device 200 or a peripheral device coupled to it).

At least one other signal of the plurality of digital audio signals may relate to system sounds 216, generated within the operating system or other software responsive to detection of an event (e.g. an incoming message or call, an alarm, etc), or user input (e.g. button or key clicks, interaction with a game, etc). System sounds are generally shorter than music and therefore, relative to playback of the audio file 212, the system sounds 216 can be considered intermittent. It will be noted that the fidelity of system sounds can generally be lower than that associated with music playback.

The system sounds 216 may also be associated with a volume parameter (termed herein, "the second volume parameter") 218. Again, the second volume parameter may be written in a register within or accessible by the AP 210, for example. The second volume parameter may be set based on user input or hard-coded into the operating system. In the former case, for example, the user may specify the volume of system sounds to be played from a particular application or from the operating system in general (e.g. through interaction with the application or configuration settings associated with the application, or through interaction with the operating system or configuration settings associated with the operating system). In the latter case, the volume of system sounds may be placed beyond the user's control.

The second volume parameter 218 may also be provided to the codec 230 (and indeed FIG. 3 below describes such an embodiment). However, in the embodiment illustrated in FIG. 2, the second volume parameter 218 is applied to the system sound audio signal in a gain element 219 within the AP 210. Thus the output of the gain element 219 is a digital audio signal, corresponding to the system sounds, to which a volume parameter has already been applied.

It will further be understood by those skilled in the art that, although FIG. 2 shows a single system sounds module 216 (i.e. from which all system sounds are output), the various system sounds generated may be output separately from the AP 210. A volume parameter may be associated with a single system sound (i.e. a one-to-one mapping between volume parameters and system sounds), a group of system sounds (i.e. a one-to-many mapping between volume parameters and system sounds) or all system sounds. In some embodiments, no volume parameter may be provided for the system sounds, which are instead generated at the required volume ab initio.

Thus, more than two digital audio signals may be output from the AP 210 to the codec 230. The audio signals may be associated with volume parameters or not.

The internal interface circuitry 220 may be any interface, bus or other circuitry suitable for passing signals from one component of the device 200 to another, and may implement any suitable data transfer protocol. For example, the interface circuitry 220 may implement the $I^2S$ interface standard, and transfer pulse code modulated (PCM) signals or direct stream digital (DSD) signals between the AP 210 and the codec 230. However, alternative interface standards and encoding mechanisms may be used without departing from the scope of the claims appended hereto. Those skilled in the art will realise that the disclosures herein are not limited in that respect.

As noted above, the codec 230 is operative to receive the digital audio signals from the AP 210, convert those digital audio signals to the analogue domain, apply an analogue gain, and output the analogue signals (with applied gain). Detailed operation of the codec 230 is described below. However, in general terms the digital audio signal 212, the first volume parameter 214 and the output of the gain element 219 are provided to gain and mix control circuitry (hereinafter, "control circuitry") 232 within the codec 230. The control circuitry 232 is operative to apply one or more digital gains to the respective audio signals, and to combine the audio signals once the digital gain has been applied. The combined digital audio signal is then provided to a digital-to-analogue converter (DAC) 234, which converts the signal to the analogue domain, the analogue signal is provided to a power amplifier 236 for application of an analogue gain.

The control circuitry 232 is also operative to set the analogue gain in the power amplifier 236. For example, according to embodiments of the disclosure, the control circuitry 234 is operable to select the analogue gain based on a combination of the digital audio signals output from the AP 210, optionally after application of any volume parameter associated with the first and second digital audio signals (such as the first volume parameter 214). The digital gains applied to the digital signals may be set based on any volume parameter associated with the digital signal and received by the codec 230, adapted so as to compensate for the analogue gain applied in the power amplifier 236.

The technical effect of this is to increase the dynamic range of the amplifier 236 when playing only the audio file 212, but to dynamically and automatically trade-off the dynamic range of the audio file when a system sound is generated so as to improve the noise performance of the amplifier 236 in those circumstances. Further detail regarding this aspect is provided below with respect to FIG. 3.

Thus the codec 230 outputs an amplified analogue audio signal corresponding to a combination of the audio file 212 and the system sounds 216. In the illustrated embodiment, the analogue audio signal is output to external interface circuitry 240. For example, one or more speakers, or a set of headphones, or in general one or more audio transducers, may be coupled to the external interface circuitry 240. The external interface circuitry 240 may therefore comprise an audio plug, into which an audio jack (such as a 3.5 mm jack) or any other suitable connector (such as a Lightning® connector, USB connector, etc) can be inserted.

It will further be understood that the audio transducer or transducers may be provided within the electronic device itself (although this embodiment is not illustrated). In such an arrangement, the analogue signal may be provided from the codec 230 directly to the one or more audio transducers for playback to the user.

Figure 3:
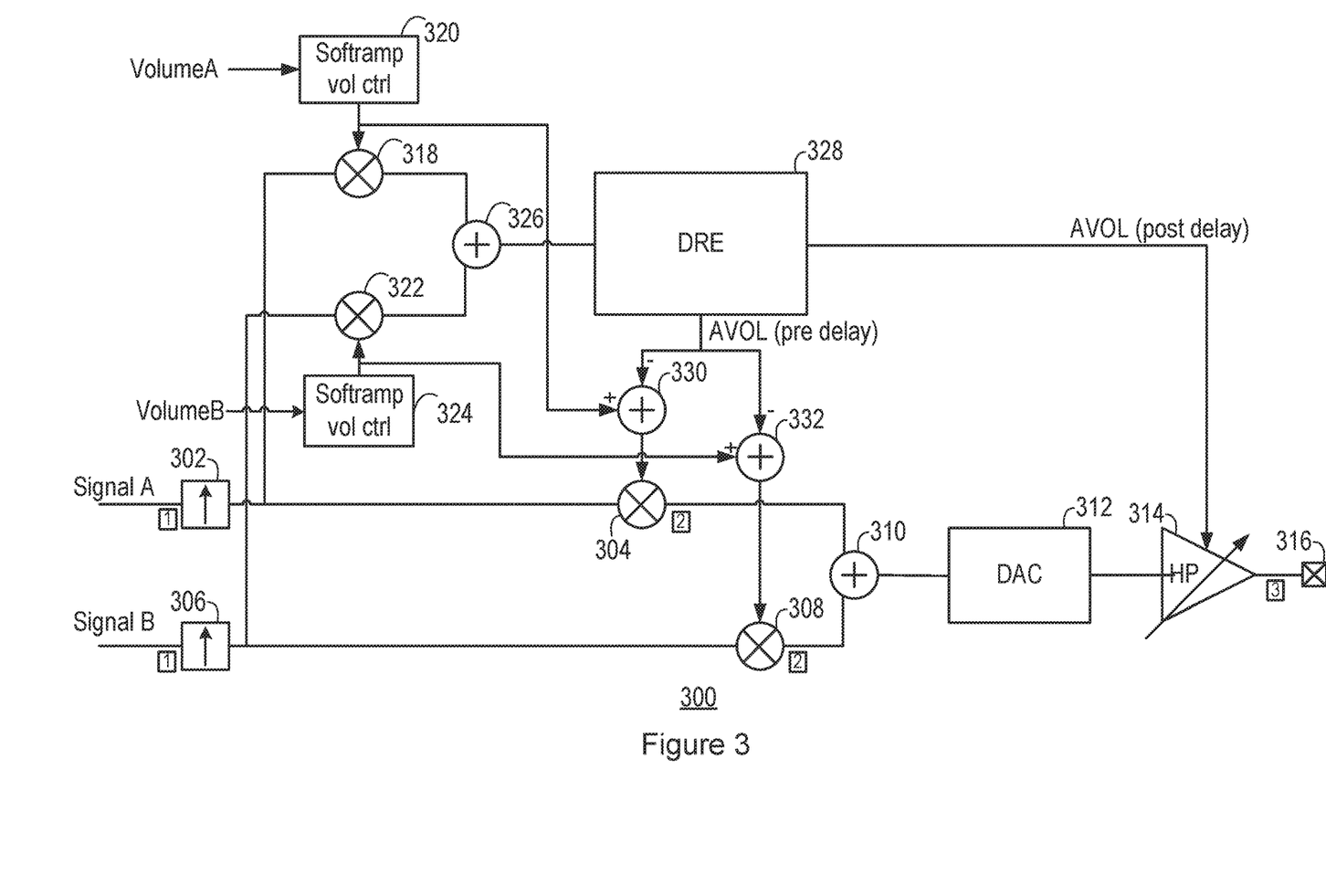
FIG. 3 shows codec circuitry according to embodiments of the disclosure.

FIG. 3 illustrates apparatus 300 according to embodiments of the disclosure. For example, the apparatus 300 may be suitable to provide the functions of the codec 230 described above with respect to FIG. 2.

In FIG. 3, two signal paths are illustrated: "Signal A" (which may be taken to correspond substantially to the audio, or music file 212); "Signal B" (which may be taken to correspond substantially to system sounds 216, or the output of gain element 219, as described above). As noted above, however, more than two signal paths may be provided in order to combine more than two audio signals. For example, an audio signal may be provided comprising voice data. The concepts disclosed herein are not limited in that respect. In general herein, any two or more audio streams, of any frame rate and/or bit width, may be combined according to the principles disclosed herein.

Further, FIG. 3 shows the application of respective volume parameters for Signal A and Signal B, denoted VolumeA and VolumeB. However, in some embodiments, only one volume parameter (i.e. for one of the signals) may be provided to the apparatus. For example, FIG. 2 illustrates an embodiment in which a volume is applied to an audio signal within the AP 210, i.e. outside the codec 230 and the apparatus 300. In that case, the VolumeB parameter of FIG. 3 may be ignored.

Thus Signal A (which is a digital audio signal, and may be representative of music or some other signal requiring high-fidelity output) is provided on a first signal path to a first upsampling unit 302. The upsampling unit 302 upsamples the signal according to a clock signal provided to it (not shown). For example, the signal may be upsampled from a conventional sampling frequency for audio of 48 kHz or 192 kHz, to a higher frequency of 3 MHz or greater. The higher sampling frequency enables changes to the digital and analogue gains (described below) to be closely matched in the time domain, so as to avoid "pops", "clicks" and other unwanted artefacts which may be audible to the user. The upsampled signal is provided to a first digital gain element 304, where a first digital gain is applied.

Similarly, Signal B (which is a digital audio signal, and may be representative of system sounds or some other signal not requiring high-fidelity output) is provided on a second signal path to a second upsampling unit 306. The upsampling unit 306 upsamples the signal in a similar manner to the upsampling unit 302, and the upsampled signal is provided to a second digital gain element 308, where a second digital gain is applied.

The outputs of the first and second digital gain elements 304, 308 are summed in a summing element 310, and provided to digital-to-analogue converter (DAC) circuitry 312, which converts the summed digital signal to the analogue domain. Those skilled in the art will be familiar with many different processes and circuits which can perform this DAC function, and the DAC circuitry 312 is not described further herein.

The output of the DAC circuitry 312 (which is an analogue audio signal) is provided to a power amplifier 314. The power amplifier 314 applies an analogue gain to the signal, and outputs an amplified analogue signal to an output 316. The analogue gain is typically an attenuation of the signal. As noted above, the amplified analogue signal may be provided to an audio transducer, either within the same electronic device as the apparatus 300, or coupled to that device.

Thus first and second digital gains are applied to signal A and signal B, before the signals are combined and converted to the analogue domain. An analogue gain is applied to the analogue signal, which is then output from the apparatus 300. Those skilled in the art will appreciate that alternative circuitry may be provided which achieves substantially the same effect. For example, both FIGS. 2 and 3 show the application of digital gain to the first and second digital audio signals, and the combination of those digital signals prior to conversion to the analogue domain (in the control circuitry 234 or the combining element 310). However, it will be apparent that the digital signals may be converted to the analogue domain separately, and then combined, without altering the operation of the circuitry significantly and without departing from the scope of the claims appended hereto.

In order to determine the first and second digital gains, and the analogue gain, which are to be applied to the various signals in the apparatus 300, the apparatus comprises control circuitry operable to provide control signals to the first and second digital gain elements 304, 308 and the power amplifier 314 to control and set the gains to be applied in those elements.

The control circuitry comprises a further digital gain element 318, which is coupled to the output of the upsampler 302 to receive the upsampled version of signal A. The digital gain element 318 applies a gain to the signal which is based on the volume parameter VolumeA.

As described herein, VolumeA and other gain factors are defined in terms of a logarithmic ratio (such as decibels) between an input signal and a desired output signal. For example, the gain factor may define logarithmically the ratio between a full-scale input signal and a desired output signal (which may have a smaller amplitude). For example, when defined in terms of decibels, a gain factor of −6 may be approximately equal to a multiplication factor of 0.5. The application of those logarithmic gain factors may be effected in the digital gain element 318 and other gain elements by use of a suitable converter on the gain operand, to convert the logarithmic value to a linear gain value, prior to the multiplication of the linear gain value with the signal. This is conventional and will be well understood by those skilled in the art. Thus, in the illustrated embodiment, each of the digital gain elements 304, 308, 318 and 322 (see below) may comprise a suitable converter for converting the logarithmic gain factor (i.e. defined in terms of dBs) to a linear equivalent value.

It will be further understood that the volume parameters and gain factors may also be defined in terms of the direct multiplication factor to be applied to the signals in question, with suitable amendments to the circuitry to account for the formal change.

The gain factor applied in the digital gain element 318 may further be adapted by a softramp control module 320. The softramp control module 320 may adapt the volume parameter VolumeA (which may be received from the AP 210, see above) so as to smooth transitions between different values of the volume parameter and avoid unwanted audio artefacts caused by any abrupt change in the volume.

Similarly, the control circuitry comprises another digital gain element 322, coupled to the output of the upsampler 306 to receive the upsampled version of signal B. The digital gain element 322 applies a gain to the signal which is based on the volume parameter VolumeB (which may also be provided from the AP 210 or accessible in a register). Again, the volume parameter VolumeB may be further adapted by a softramp control module 324, similar to the module 320.

The outputs of the gain elements 318, 322 are provided to a combining element 326, which sums them and provides the summed output to DRE circuitry 328. Thus the DRE circuitry 328 receives a signal which is equal to (SignalA*VolumeA+SignalB*VolumeB), wherein the operator * relates to application of a gain (i.e. defined in terms of decibels) rather than direct multiplication of two quantities, as noted above. For example, if signalA and signalB are both equal to 1, VolumeA is equal to −6 dB and VolumeB is equal to −9 dB, the DRE circuitry 328 receives a signal which is approximately equal to 0.5+0.35=0.85.

According to embodiments of the disclosure, the DRE circuitry 328 provides an analogue gain parameter AVOL to the power amplifier 314, which is based on a combination of signal A and signal B or signals derived therefrom. In one embodiment, the analogue gain may be set to (SignalA*VolumeA+SignalB*VolumeB), i.e. the output of the combining element 326. The DRE circuitry 328 may comprise an envelope detector (not illustrated) which determines an envelope of the output of the combining element 326, SignalA*VolumeA+SignalB*VolumeB, and applies the envelope as the analogue gain parameter AVOL.

In some embodiments, the range of gain applicable in the amplifier 314 and/or the digital gain elements 304, 308 may not be continuous. That is, the gain may only be applied at certain discrete values. In that case, the analogue gain may be rounded to a nearest such discrete value, such as a whole number of decibels. Further, the range of gain applicable in the amplifier 314 and/or the digital gain elements 304, 308 may have a lower limit. In that case, the analogue gain may be equal to the lower limit in the event that the above calculation results in a gain factor which is below the lower limit.

The analogue gain parameter may be subject to a delay, to account for delay in the DAC circuitry 312, such that a particular value of the analogue gain is applied to a signal on the digital components of which the analogue gain was determined.

The analogue gain is also provided to combining elements 330, 332, to be used in determining the digital gains to be applied in digital gain elements 304, 308. The analogue gain AVOL so provided may not be subject to the same delay applied to the analogue gain AVOL provided to the power amplifier 314, as the digital gains are applied prior to the processing in DAC circuitry 312.

Further, the analogue gain is defined in some embodiments as equivalent to the output of the combining element 326, i.e. SignalA*VolumeA+SignalB*VolumeB. This quantity is linear. When provided to combining elements 330, 332, however, the quantity may be converted back to a logarithmic equivalent (i.e. dBs). In the example given above, where signalA and signalB are both equal to 1, VolumeA is equal to −6 dB and VolumeB is equal to −9 dB, the analogue gain factor AVOL in linear terms is 0.85. In logarithmic terms, this is equal to −1.4 dB (which may be rounded to −1 dB).

One combining element 330 receives the volume parameter VolumeA (or the output of the softramp control module 320), the analogue gain from DRE circuitry 328, and outputs a signal equal to the difference, e.g., VolumeA−AVOL. The other combining element 332 receives the volume parameter VolumeB (or the output of the softramp control module 324), the analogue gain from DRE circuitry 328, and outputs a signal equal to the difference, e.g., VolumeB−AVOL. So, for example, if VolumeA is −6 dB, and AVOL is −1 dB, then the digital gain factor applied in combining element 330 is −5 dB. Similarly, if VolumeB is −9 dB, and AVOL is −1 dB, then the digital gain factor applied in combining element 332 is −8 dB.

The outputs of the combining elements 330, 332 are the digital gain factors to be applied to signal A and signal B. Thus, the output of combining element 330 is provided to digital gain element 304, and a digital gain factor equal to VolumeA−AVOL is applied to signal A. The output of combining element 332 is provided to digital gain element 308, and a digital gain factor equal to VolumeB−AVOL is applied to signal B.

It will be noted that the analogue gain applied in the power amplifier 314 (i.e. to the combination of audio signals) is thus effectively compensated for by corresponding alterations in the digital gains applied to each signal individually. The net effect of this circuitry is that signal A is preserved when it is the sole audio signal, maximizing the dynamic range of the amplifier 314 using an analogue volume. When signal B is added (such as a system sound), the dynamic range of signal A is traded off via digital attenuation. The changes in digital and analogue gain factors may be closely correlated to ensure that audible artefacts arising from the dynamically changing gain factors are reduced or eliminated entirely.

It will be noted that in some embodiments it may be possible for the analogue gain factor AVOL applied in the power amplifier 314 to amplify the combined signal to a point at which clipping occurs (i.e. where the amplifier is overdriven and attempts to output a signal which is beyond its maximum capability). Such clipping results in undesirable distortion of the sound. In order to prevent this, the DRE control circuitry 328 may further comprise a clipping detection circuit operable to detect such a clipping condition, and dynamically alter the gains applied in one or more of the digital gain elements 304, 308, 318, 322 or the power amplifier 314, so as to prevent clipping.

Figure 4:
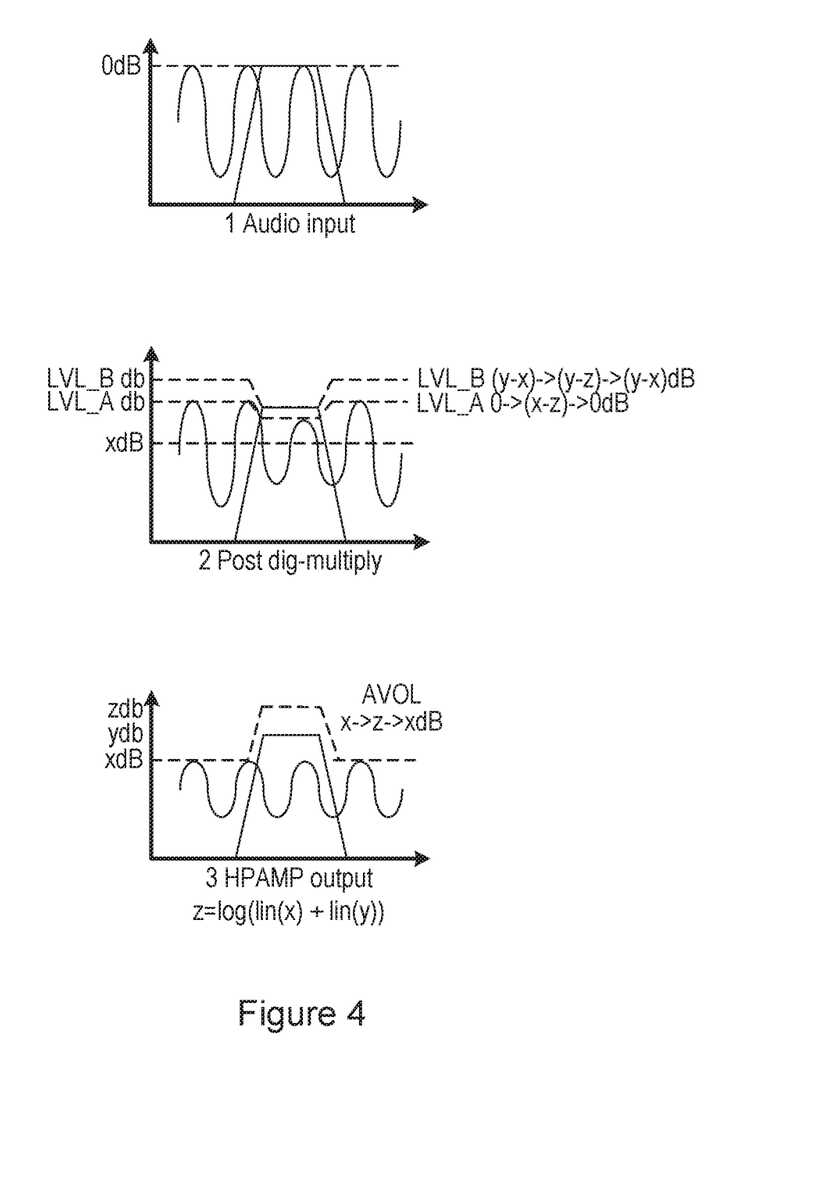
FIG. 4 shows the application of gain to audio signals according to embodiments of the disclosure.
Figure 5:
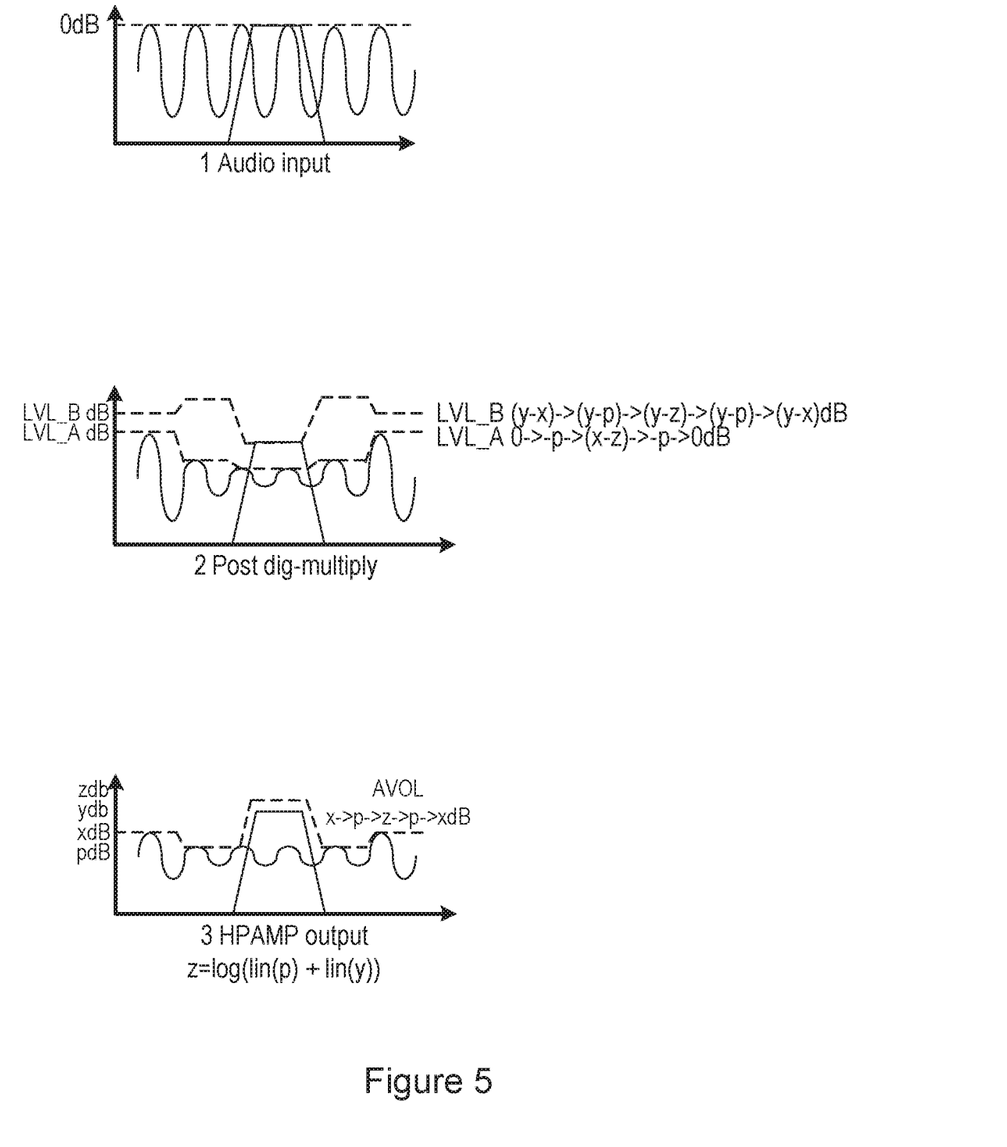
FIG. 5 shows the application of gain to audio signals according to further embodiments of the disclosure.

The circuitry shown in FIG. 3 is useful whenever more than one audio signal is output simultaneously from the same speaker. FIGS. 4 and 5 show two possible use cases and the signals present in the circuitry of FIG. 3 in each use case.

FIG. 4 shows, in schematic form, the signals at various stages within the circuitry shown in FIG. 3, identified by the numbers 1, 2 and 3 located in squares. In the uppermost diagram, the signals at location 1 are illustrated; in the middle diagram, the signals at location 2 are illustrated; and in the lowermost diagram, the signals at location 3 are illustrated. To aid comprehension, only the first audio signal (i.e. signal A) is shown as a wave. The second audio signal (i.e. signal B) is shown at a steady amplitude. The dashed lines show gain settings in the various gain elements. For example, LVL_A shows the gain setting in digital gain element 304 (i.e. for signal A). LVL_B shows the gain setting in digital gain element 308 (i.e. for signal B). AVOL is the analogue gain applied in amplifier 314.

The signals of FIG. 4 may correspond to embodiments in which the system sounds (i.e. signal B) are mixed immediately with the audio file (i.e. signal A) upon generation. For example, key clicks and similar system sounds are required to provide instantaneous feedback to a user of a successful action (i.e. the press of a button). In such cases, the key click must be mixed with any overriding audio signal immediately, or within a very short time frame.

Thus at stage 1, signals A and B are input to the apparatus 300. As noted above, we assume for simplicity that each signal is "full scale", and equal to a nominal volume of 0 dB. However, in other embodiments that may not be the case. Initially, only signal A is present; then signal B is present, in addition to signal A; then signal B stops, with only signal A remaining.

As noted above, the gain applied in the power amplifier 314 is typically an attenuation, and thus the volume parameters VolumeA and VolumeB are also typically attenuations.

In the illustrated embodiment, VolumeA is equal to a value x dB, while VolumeB is equal to a value y dB, with both x and y being negative numbers.

Considering only the situation in the absence of signal B (i.e. before and after signal B is present), after the digital gain is applied, signal A is equal to 0 dB. That is, the analogue gain is calculated as x*signalA, and the digital gain is calculated as x−x*signal (again, where the symbol * corresponds to the application of logarithmic gain to the signal).

The digital gain applied to signal B, in the absence of signal B, is equal to y−x. However, as the signal is absent, there are no changes to the analogue gain.

When signal B is present in addition to signal A, the analogue gain increases (becomes less negative) to a value z, which may be equivalent to log(lin(x)+lin(y)) when both signal A and signal B are equal to 1. The digital gains then correct in the opposite direction to ensure that the full path output (i.e. including the digital and analogue gains) is equal to the sum of the two signals multiplied by their respective volumes. Signal A in particular is attenuated by action of the digital gain, and therefore some dynamic range is lost in the signal when signal B is present. However, overall the scheme provides an appropriate trade-off between the dynamic range of signal A and the need to accommodate multiple audio signals simultaneously.

Similar to FIG. 4, FIG. 5 shows, in schematic form, the signals at various stages within the circuitry shown in FIG. 3 according to further embodiments of the disclosure. In the uppermost diagram, the signals at location 1 are illustrated; in the middle diagram, the signals at location 2 are illustrated; and in the lowermost diagram, the signals at location 3 are illustrated. To aid comprehension, only the first audio signal (i.e. signal A) is shown as a wave. The second audio signal (i.e. signal B) is shown at a steady amplitude.

The signals of FIG. 5 correspond to embodiments in which the overriding audio signal is "ducked" for a period of time prior to playback of the system sound. The overriding audio signal may also be ducked for a period of time after playback of the system sound. Such embodiments may be suitable where immediate feedback to the user is not required, and/or when the operating system has advance knowledge that a system sound is about to be generated. For example, a notification sound (e.g. of an incoming phone call or message, or an event associated with another application running on the device) or an alarm sound may fall within this category.

The signals of FIG. 5 correspond in large part to those of FIG. 4, with the addition of intermediate stages during the transitions from an output comprising only signal A to an output comprising signal A and signal B, and vice versa. Thus, the overall output signal is initially equal to signal A, to which the volume x has been applied. For a period prior to the introduction of signal B, the volume of signal A is reduced to a lower level −p dB. The lower level may be preset by the AP 210, for example, and defined as an absolute value or a value which is relative to the regular volume x dB. Signal B is then introduced, at a volume y dB, and signal A is maintained at −p dB. When signal B is removed, signal A remains at −p dB for a period of time, before being increased to the regular volume x dB.

At each stage of the process, the digital gains and the analogue gain automatically adjust to the changing volumes and signals, so as to ensure the maximum dynamic range enhancement where possible, or a suitable compromise when not possible (i.e. when combining multiple audio signals).

Figure 6:
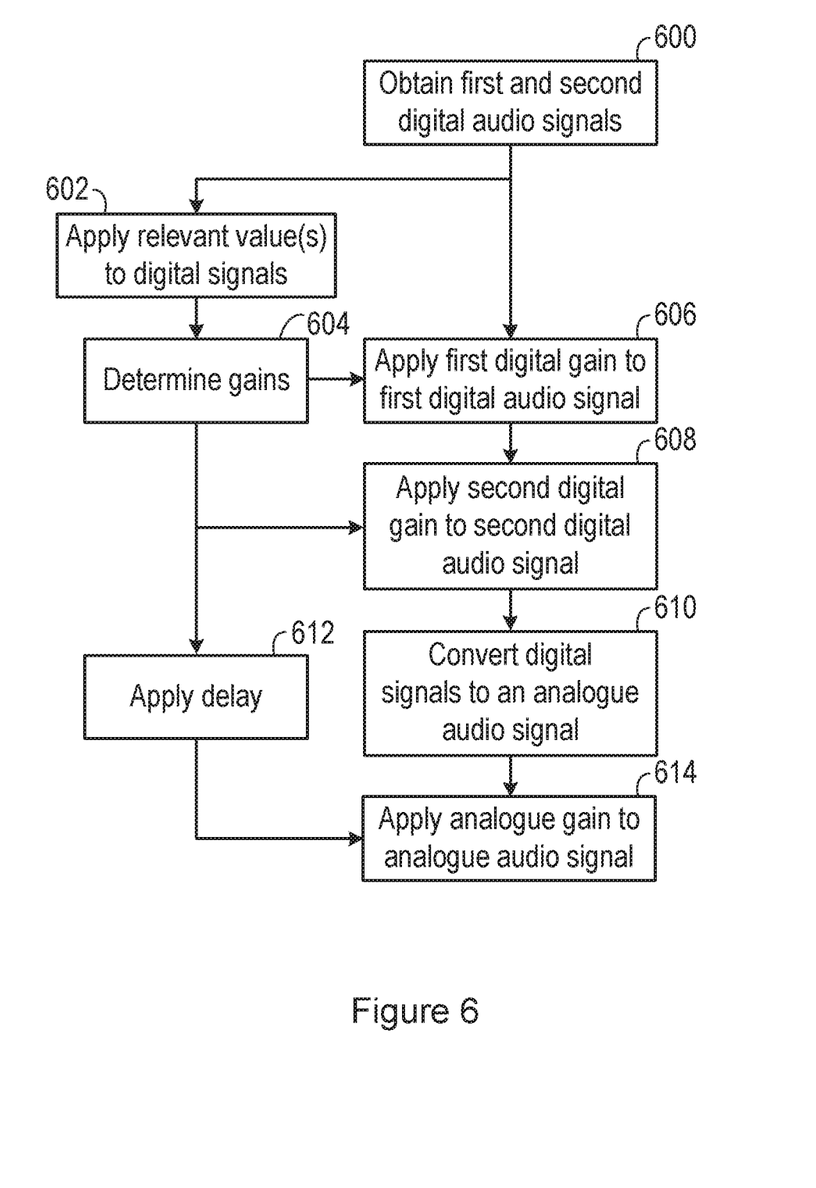
FIG. 6 is a flowchart of a method according to embodiments of the disclosure.

FIG. 6 is a flowchart of a method according to embodiments of the disclosure. The method may be carried out in a codec, such as the codec 230 or apparatus 300 described above.

The method begins in step 600, in which first and second digital audio input signals are obtained. The signals may be generated within the codec, or provided to the codec from another device. According to the method, the first and second digital audio input signals are subject to first and second digital gains, and their combination (in the analogue domain) is subject to an analogue gain. Thus the method comprises a process of determining the appropriate gains and a process of applying those gains, which processes may be conducted in parallel.

One or both of the digital audio input signals may be associated with volume parameters, also provided to the codec or accessible by the codec. In step 602, in order to determine the appropriate gains, the relevant volume parameters are applied to the first and second digital audio input signals as digital gain factors. If no volume parameter is defined for a particular digital audio input signal, no gain factor is applied in this step.

In step 604, first and second digital gains, and an analogue gain, are determined based on the output of step 602. For example, the first and second digital audio input signals, with any appropriate volume factors applied, may be combined (e.g. summed) and the gains determined on the basis of the combination. In one embodiment, the analogue gain may be determined as the sum of the first and second digital audio input signals, with respective volumes applied as described above. The first digital gain may be determined as a difference of the volume associated with the first digital audio input signal and the analogue gain. The second digital gain may be determined as a difference of the volume associated with the second digital audio input signal and the analogue gain.

In step 606, the first digital gain is applied to the first digital audio input signal. In step 608, the second digital gain is applied to the second digital audio input signal.

In step 610, the first and second digital audio input signals, after application of the first and second digital gains, are converted to the analogue domain in a single combined analogue signal. For example, the first and second digital audio input signals may be combined into a combined digital signal, before conversion to a corresponding analogue signal. Alternatively, the first and second digital audio input signals may each be converted to respective analogue signals before being combined.

In step 614, the analogue gain determined in step 604 is applied to the combined analogue signal, for example in a power amplifier. The conversion in step 610 may introduce some delay to the signals, and therefore the analogue gain may also be delayed by a corresponding amount in step 612, to ensure that the correct gain is applied to the correct signal.

The present disclosure thus provides methods, apparatus and systems for the output of an audio signal to an audio transducer. In particular, the concepts disclosed herein utilize dynamic range enhancement techniques to improve or maximize the dynamic range of an audio signal (particularly an audio signal requiring high-fidelity output, such as music), while allowing for trade-off of the dynamic range when an additional audio signal (such as system sounds, etc) requires to be output simultaneously.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

The invention claimed is:

1. An apparatus for providing an output signal to a transducer, comprising:
digital gain circuitry, for independently applying one or more digital gains to each of a plurality of different types of digital input signals, and outputting a plurality of amplified digital input signals;
converter circuitry, for combining and converting the plurality of amplified digital input signals to an analogue signal, and outputting the analogue signal; and
analogue gain circuitry, for applying an analogue gain to the analogue signal, and outputting the output signal.

2. The apparatus according to claim 1, wherein the more than one digital gain and the analogue gain are selected so as to apply dynamic range enhancement to the plurality of digital input signals.

3. The apparatus according to claim 1, wherein the analogue gain is selected based on a combination of the plurality of digital input signals or signals derived therefrom.

4. The apparatus according to claim 1, wherein the more than one digital gain are selected so as to compensate for the analogue gain.

5. The apparatus according to claim 1, further comprising an input for receiving a first volume parameter associated with a first digital input signal of the plurality of digital input signals.

6. The apparatus according to claim 5, wherein the analogue gain is selected based on a combination of the result of an application of the first volume parameter to the first digital input signal, and digital input signals other than the first digital input signal of the plurality of digital input signals, or signals derived therefrom.

7. The apparatus according to claim 5, wherein the first digital gain is selected based on a difference between the first volume parameter and the analogue gain.

8. The apparatus according to claim 5, wherein the analogue gain is selected based on a sum of the result of an application of the first volume parameter to the first digital input signal, and digital input signals other than the first digital input signal of the plurality of digital input signals, or signals derived therefrom.

9. The apparatus according to claim 1, wherein the analogue gain is configured with a delay to compensate for delay caused by the converter circuitry.

10. The apparatus according to claim 1, wherein a second digital input signal of the plurality of digital input signals is intermittent, such that the analogue gain and the more than one digital gain are selected so as to compensate for the presence and absence of the second digital input signal.

11. The apparatus according to claim 10, further comprising an input for receiving a first volume parameter associated with a first digital input signal of the plurality of digital input signals, wherein the first volume parameter is automatically reduced for a period of time prior to the presence of the second digital input signal.

12. The apparatus according to claim 1, wherein the first digital input signal is a full-amplitude signal.

13. The apparatus according to claim 1, wherein the analogue gain is selected such that a width of a combination of at least the plurality of amplified digital input signals matches a capacity of the converter circuitry.

14. The apparatus according to claim 1, wherein the digital input signals comprise audio data, and wherein the analogue signal is an analogue audio signal.

15. The apparatus according to claim 14, wherein a first digital input signal of the plurality of digital input signals corresponds to music, and wherein a second digital input signal of the plurality of digital input signals corresponds to system sounds.

16. An apparatus according to claim 1.

17. The electronic device according to claim 16, further comprising processor circuitry, configured to provide to the apparatus one or more of the plurality of digital input signals.

18. The electronic device according to claim 17, wherein the apparatus further comprises an input for receiving a first volume parameter associated with a first digital input signal of the plurality of digital input signals, and wherein the processor circuitry is further configured to provide to the apparatus the first volume parameter.

19. An electronic device according to claim 16, wherein the electronic device is at least one of: a portable device; a battery powered device; a communications device; a computing device; a mobile telephone; a laptop, notebook or tablet computer; a personal media player; a gaming device; and a wearable device.

20. A method for providing an output signal to a transducer, comprising:
receiving a plurality of different types of digital input signals;
independently applying one or more digital gains to each of the plurality of digital input signals, and outputting a plurality of amplified digital input signals;
combining and converting the amplified plurality of digital input signals into an analogue signal, and outputting the analogue signal; and
applying an analogue gain to the analogue signal and outputting the output signal.

* * * * *

UNITED STATES PATENT AND TRADEMARK OFFICE
CERTIFICATE OF CORRECTION

| | | |
|---|---|---|
| PATENT NO. | : 11,064,293 B2 | Page 1 of 1 |
| APPLICATION NO. | : 16/667224 | |
| DATED | : July 13, 2021 | |
| INVENTOR(S) | : Morgan et al. | |

It is certified that error appears in the above-identified patent and that said Letters Patent is hereby corrected as shown below:

In the Claims

In Column 14, Line 4, in Claim 16, delete "An apparatus according to claim 1." and insert
-- An electronic device comprising:
an apparatus according to claim 1. --, therefor.

Signed and Sealed this
Fifteenth Day of August, 2023

Katherine Kelly Vidal
*Director of the United States Patent and Trademark Office*